United States Patent
Wu et al.

(10) Patent No.: US 10,244,647 B2
(45) Date of Patent: Mar. 26, 2019

(54) SUBSTRATE WITH INSULATING LAYER

(71) Applicant: HEWLETT-PACKARD DEVELOPMENT COMPANY, L.P., Houston, TX (US)

(72) Inventors: Kuan-Ting Wu, Taipei (TW); Yu-Chuan Kang, Taipei (TW); Chung-Hung Huang, Taipei (TW)

(73) Assignee: HEWLETT-PACKARD DEVELOPMENT COMPANY, L.P., Spring, TX (US)

( * ) Notice: Subject to any disclaimer, the term of this patent is extended or adjusted under 35 U.S.C. 154(b) by 137 days.

(21) Appl. No.: 15/031,594

(22) PCT Filed: Feb. 14, 2014

(86) PCT No.: PCT/US2014/016400
§ 371 (c)(1),
(2) Date: Apr. 22, 2016

(87) PCT Pub. No.: WO2015/122901
PCT Pub. Date: Aug. 20, 2015

(65) Prior Publication Data
US 2016/0345451 A1 Nov. 24, 2016

(51) Int. Cl.
| | |
|---|---|
| *H05K 5/02* | (2006.01) |
| *H05K 5/04* | (2006.01) |
| *H05H 1/48* | (2006.01) |
| *C25D 13/10* | (2006.01) |
| *C25D 13/12* | (2006.01) |

(Continued)

(52) U.S. Cl.
CPC ......... *H05K 5/0247* (2013.01); *C09D 5/443* (2013.01); *C09D 5/4411* (2013.01); *C25D 11/022* (2013.01); *C25D 11/026* (2013.01); *C25D 11/06* (2013.01); *C25D 11/26* (2013.01); *C25D 11/30* (2013.01); *C25D 11/34* (2013.01); *C25D 13/10* (2013.01); *C25D 13/12* (2013.01);

(Continued)

(58) Field of Classification Search
USPC ........ 428/457, 458, 461, 465; 427/473, 569, 427/580; 264/405
See application file for complete search history.

(56) References Cited

U.S. PATENT DOCUMENTS

| | | | | |
|---|---|---|---|---|
| 3,442,742 A | * | 5/1969 | Jorgensen | ................ B41M 1/28 101/211 |
| 4,065,587 A | * | 12/1977 | Ting | ..................... C08F 299/06 427/512 |

(Continued)

FOREIGN PATENT DOCUMENTS

| | | |
|---|---|---|
| CN | 101634044 | 1/2010 |
| CN | 101671836 | 3/2010 |

(Continued)

OTHER PUBLICATIONS

Hao, Jianmin, et al., "Study of Double-polar Micro-arc Oxidation Ceramic Layers on Aluminum Alloy", Advanced Materials Research vols. 189-193 (2011), pp. 684-687, Trans Tech Publications, Switzerland, Scientific.Net.

*Primary Examiner* — Tae H Yoon
(74) *Attorney, Agent, or Firm* — HPI Patent Department

(57) ABSTRACT

A substrate with a Micro-Arc Oxidation (MAO) layer or an electrophoretic deposition (ED) layer on a first side of the substrate and an electrically insulating layer on a second side of the substrate.

14 Claims, 4 Drawing Sheets

(51) Int. Cl.
  *C25D 11/02* (2006.01)
  *C25D 11/06* (2006.01)
  *C25D 11/26* (2006.01)
  *C25D 11/30* (2006.01)
  *C25D 11/34* (2006.01)
  *C25D 13/22* (2006.01)
  *C25D 15/00* (2006.01)
  *C09D 5/44* (2006.01)
  *C25D 13/14* (2006.01)

(52) U.S. Cl.
  CPC ............ *C25D 13/14* (2013.01); *C25D 13/22* (2013.01); *C25D 15/00* (2013.01); *H05K 5/04* (2013.01)

(56) References Cited

U.S. PATENT DOCUMENTS

| | | | | |
|---|---|---|---|---|
| 4,601,916 | A * | 7/1986 | Arachtingi | C25D 13/00 204/479 |
| 5,702,581 | A * | 12/1997 | Kerlin | C09D 5/448 204/486 |
| 6,423,425 | B1 * | 7/2002 | Faucher | C08G 18/0814 204/484 |
| 7,399,397 | B2 * | 7/2008 | Buettner | B05D 7/14 204/488 |
| 8,587,945 | B1 * | 11/2013 | Hartmann | H05K 7/20454 361/679.53 |
| 2002/0014748 | A1 * | 2/2002 | McCullough | F16J 15/064 277/627 |
| 2006/0244143 | A1 | 11/2006 | Bhatia et al. | |
| 2009/0041988 | A1 * | 2/2009 | Ho | C25D 11/04 428/172 |
| 2010/0108344 | A1 | 5/2010 | Huang et al. | |
| 2010/0112298 | A1 | 5/2010 | Dai et al. | |
| 2013/0221816 | A1 | 8/2013 | Liou et al. | |

FOREIGN PATENT DOCUMENTS

| | | |
|---|---|---|
| CN | 201809466 | 4/2011 |
| CN | 102212859 | 10/2011 |
| CN | 103060881 | 4/2013 |

* cited by examiner

SUBSTRATE WITH INSULATING LAYER

This application is a 371 National Stage Application of International Application No. PCT/US2014/016400, filed Feb. 14, 2014, which is hereby incorporated by reference in its entirety.

BACKGROUND

Electronic devices, such as mobile phones, smart phones, tablet computers, laptop computers etc. often have a casing. A surface of the casing may be treated by a process such as Electrophoretic Deposition (ED) or Micro-Arc Oxidation (MAO).

Electrophoretic Deposition is a process in which a substrate is placed in a fluid and a potential difference is applied to cause charged particles in the fluid to be deposited on the substrate. ED may be used to impart certain desired properties, such as hardness or toughness, or a certain desired appearance to the substrate.

Micro Arc Oxidation (MAO), also known as plasma electrolytic oxidation, is a process for generating oxide coatings on a metal substrate. MAO involves applying a relatively high electric potential difference (e.g. 200V) while the substrate is placed in an acidic or alkaline electrolyte. The electric potential causes electric discharges which result in in localized plasma reactions in conditions of high temperature and pressure that modify the oxide layer. MAO can result in a protective oxide layer having improved toughness and wear resistance.

BRIEF DESCRIPTION OF THE DRAWINGS

Examples will now be described, by way of non-limiting example only, with reference to the accompanying drawings, in which:

FIG. 3 (*b*) shows a cross section of the example substrate of FIG. 3(*a*) after MAO or ED;

FIG. 3 (*c*) shows a cross section of another example substrate to which an insulating coating has been applied;

FIG. 3 (*d*) shows a cross section of the example substrate of FIG. 3(*c*) after MAO or ED;

FIG. 3 (*e*) shows a cross section of another example substrate to which an insulating coating has been applied;

FIG. 3 (*f*) shows a cross section of the example substrate of FIG. 3(*e*) after MAO or ED;

FIG. 3 (*g*) shows a cross section of another example substrate to which an insulating coating has been applied;

FIG. 3 (*h*) shows a cross section of the example substrate of FIG. 3(*g*) after MAO or ED;

DETAILED DESCRIPTION

In the following description the terms "a" and "an" are used to denote the presence of one or more of a particular element. The phrase "a material selected from the group comprising" following by a list of materials means the material comprises one or more materials selected from the list.

The present disclosure discusses a substrate which has a first surface and a second surface. Both the first surface and the second surface are electrically conductive. According to the present disclosure an electrically insulating coating is applied to the first surface of the substrate. Electrophoretic Deposition (ED) or Micro-Arc Oxidation (MAO) is then performed on the second surface of the substrate. As the first surface is covered by an electrically insulating layer, the first surface is not affected by the ED or MAO treatment. This saves power as only the desired part of the substrate is treated. The saving may be significant for both ED and MAO, but may be even greater for MAO which has relatively high power requirements.

The substrates according to the teachings herein may have many applications. In one application the substrate is used as a casing for an electronic device. For many casings it may only be necessary to coat the exterior surface of the casing, as the exterior surface will be subject to wear and tear and will be seen by the end user. The inner surface on the other hand may not be subject to the same degree of wear and tear or scrutiny by the user and thus coating the inner surface may not have such a significant benefit. However, in conventional MAO and ED techniques the whole substrate is placed in the solution without any insulating coating and all of the substrate's surfaces are treated, which consumes more power and has lower productivity.

Examples will now be described in more detail with reference to the accompanying drawings.

Figure 1:
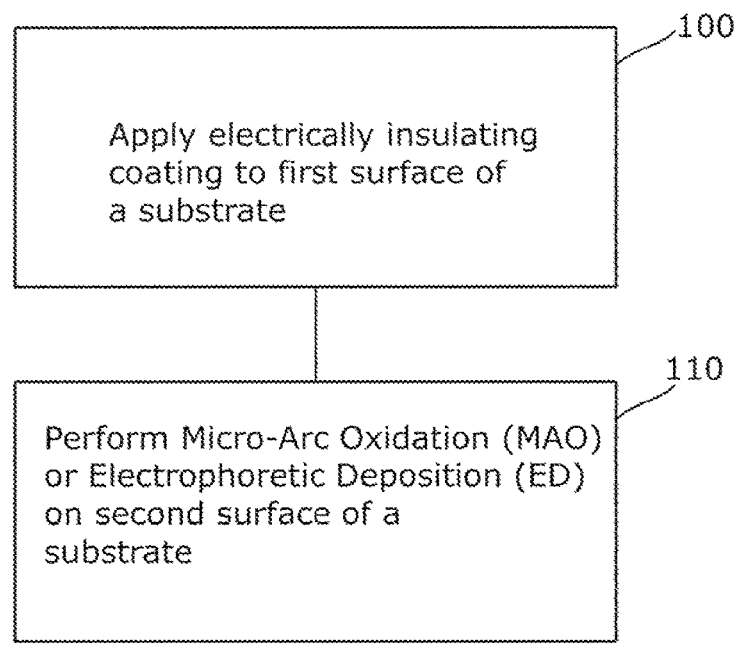
FIG. 1 is a flow chart showing an example method of treating a substrate including performing Micro-Arc Oxidation (MAO) or Electrophoretic Deposition (ED)

As shown in block 100 of FIG. 1 the process starts by applying an electrically insulating coating to a first surface of a substrate. The substrate has first and second surfaces which are electrically conductive and may for example comprise a metal.

The electrically insulating coating may for example comprise a material selected from the group comprising: polyimides, ABS (Acrylonitrile, butadiene and styrene), polyacetates, polyacrylics, nylon, epoxy, fluoropolymers, Neoprene, PEEK (PolyEtherEther-Ketone), PET (Polyethylene terephthalate), phenolics, polycarbonates, polyesters, polyolefins, polystyrene, polysulfones, polyurethanes, PVC (Polyvinyl Chloride), silicone rubber, PEI (polyetherimide) and low dielectric constant materials. A "low dielectric constant material" is a material having a dielectric constant of less than 3. In one example the insulating material comprises a fluorinated polyimide. The electrically insulating coating may for example be applied by spray coating, film transfer, physical vapor deposition or a printing technique, such as screen printing.

At block 110 the substrate is treated by MAO or ED. MAO may harden the surface of the substrate or impart other desired properties. ED may impart a desired appearance, texture or other desired properties to the surface of the substrate.

MAO may, for example, be carried out by partly or wholly immersing the substrate in an alkaline or acidic electrolyte and applying a potential difference of 200V or greater. The electrolyte may for example include one or more of the following materials: silicate, aluminate, sulfate, aluminum powder, aluminum alloy powder, and aluminum oxide ($Al_2O_3$). In one example the potential difference is between 250V and 600V. In one example the potential difference is in the range 350-450V. The electric potential causes electric discharges which result in localized plasma reactions in conditions of high temperature and pressure that modify the oxide layer. MAO results in a protective MAO layer which may have improved toughness and wear resistance.

An "MAO layer" is a layer formed by MAO treatment. The MAO layer may comprise a metal oxide and may have a structure which is at least partially crystalline. For example if the a surface of the substrate comprises a metal, then the MAO process may add a metal oxide layer which is at least partially converted from the amorphous form to the crystalline form. The MAO layer may have any thickness depending on the particular type of MAO treatment. In one example the MAO layer has a thickness of 3-30 µm. In another example the MAO layer has a thickness of 5-25 µm.

In one example a surface of the substrate comprises aluminum and the MAO layer comprises corundum which is a crystalline form of aluminum oxide. In other examples the surface may comprise another type of metal, such as but not limited to Magnesium, Lithium, Titanium, Zinc or one of their alloys, and the MAO layer may comprise an oxide of the another type of metal, said oxide being at least partially in crystalline form.

ED may, for example, be carried out by partly or wholly immersing the substrate in a solution in which charged particles are suspended and applying a potential difference so that the substrate, or the substrate surfaces, have an opposite charge to that of the charged particles. The charged particles are then deposited onto electrically conductive surfaces of the substrate. The potential difference used for ED is typically less than that used for MAO and may for example be up to 250V, but is usually 150V or less. Examples of charged particles to be deposited include polyacrylic polymer or epoxy polymer in combination of inorganic and/or metallic particles.

Figure 2:
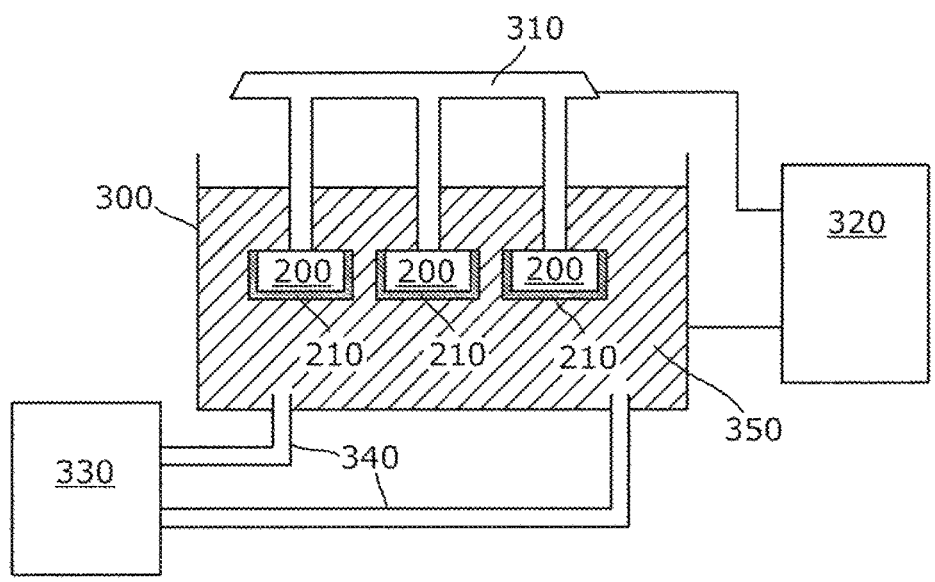
FIG. 2 shows an example apparatus for performing a method according to FIG. 1.
Figure 3A:
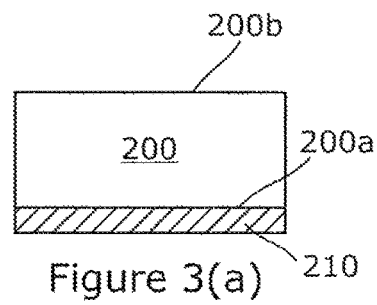
FIG. 3 (*a*) shows a cross section of an example substrate to which an insulating coating has been applied.
Figure 3B:
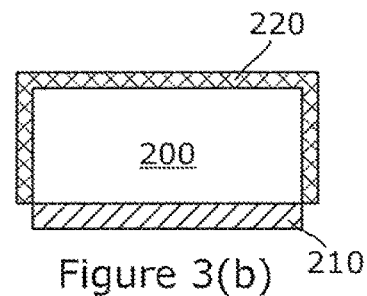
Figure 3C:
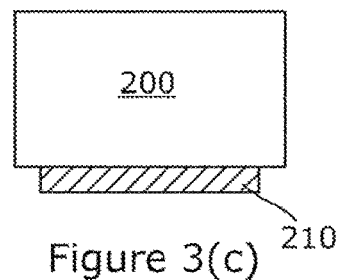
Figure 3D:
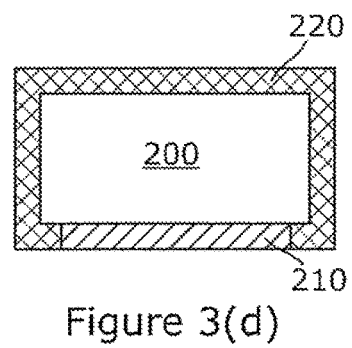
Figure 3E:
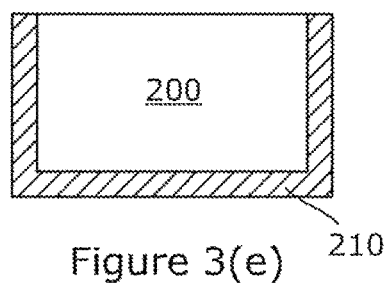
Figure 3F:
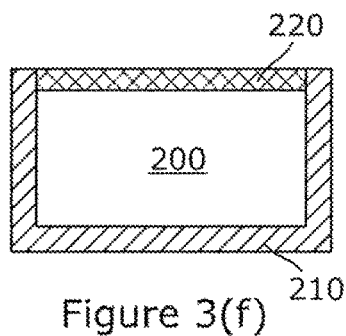
Figure 3G:
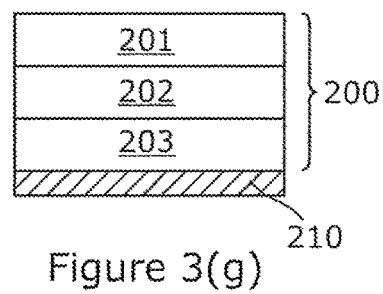
Figure 3H:
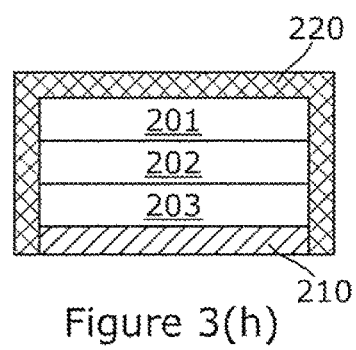

FIG. 2 shows a schematic example of apparatus for carrying out MAO or ED. The apparatus comprises a vessel 300 with walls of a conductive material such as stainless steel. The vessel acts as a bath for holding the electrolyte solution 350. The apparatus further comprises a sample holder 310 for holding the samples 200 in the solution. The samples may for example be substrates which are to be treated by MAO or ED. After treatment, the substrate material may later be used to form casings for electronic devices. A power supply 320 is connected to the sample holder 310 and the vessel 300. The power supply may thus deliver a potential difference so that the vessel acts as an anode and the samples attached to the sample holder act as cathodes (or vice versa). The power supply may be arranged to deliver the power in pulses. In another example the power supply may deliver an alternating current to the samples and the vessel 300 may be connected to ground. A cooling system 330 may be connected by pipes 340 to the vessel 300 so that the electrolyte 350 can be circulated through a cooling system to avoid overheating and/or replenish the electrolyte.

The samples shown in FIG. 2 are electrically conductive (e.g. metal) substrates 200 having an exposed upper surface and a bottom surface coated with an electrically insulating material 210.

The coated surface is not affected by the MAO or ED, because it is not electrically conductive. Only the electrically conductive surface or surfaces, which are not coated with an electrically insulating material, are affected by the MAO or ED. Accordingly, significant power and cost savings may be achieved. Examples of the substrate and the electrically insulating coating are discussed in more detail below.

FIG. 3 (a) shows an example of a cross sectional view of an electrically conductive substrate 200. The substrate may for example comprise a light metal or light metal alloy including, but not limited to Aluminium, Magnesium, Lithium, Titanium, Zinc or one of their alloys. The substrate 200 has a first electrically conductive surface 200a and a second electrically conductive surface 200b. The first surface 200a is coated with a layer of electrically insulating material 210. The insulating material may, for example, comprise a polyimide, ABS (Acrylonitrile, butadiene and styrene), polyacetate, polyacrylics, nylon, epoxy, fluoropolymer, Neoprene, PEEK (PolyEtherEther-Ketone), PET (Polyethylene terephthalate), phenolics, polycarbonate, polyester, polyolefins, polystyrene, polysulfone, polyurethane, PVC, silicone rubber, PEI (polyetherimide) or low dielectric constant material. The second surface 200b is not coated with the layer of electrically insulating material.

FIG. 3 (b) shows the example substrate of FIG. 3 (a) after it has been treated by MAO. As a result of the MAO treatment, the second surface 200b of the substrate 200 is covered by a MAO layer 220. The MAO layer may comprise a metal oxide and may have a structure which is at least partially crystalline. The MAO layer may have any thickness depending on the MAO process. In one example the MAO layer has a thickness of 3-30 µm. In another example the MAO layer has a thickness of 5-25 µm. The electrolyte used in the MAO treatment may, for example, comprise sulfate, aluminum powder, aluminum alloy powder, aluminum oxide, carbonate, silicate, borate, aluminate, aluminum hydroxide, zinc oxide, sodium hydroxide, potassium hydroxide, potassium fluoride, glycerol, aluminate, phosphate and/or a rare-earth metal.

In another example the substrate may be treated with ED instead of MAO, in that case the layer 220 will be an ED layer. An ED layer is a layer that was deposited by electrophoretic deposition. The ED layer may for example comprise a polymer, such as polyacrylic polymer or epoxy polymer, in combination with inorganic and/or metallic particles. The ED layer may have any thickness depending on the amount of material deposited. In one example the ED layer has a thickness of 3-30 µm.

FIG. 3 (c) shows a cross sectional view of a substrate according to another example. This example is similar to FIG. 3 (a), but whereas in FIG. 3 (a) substantially the entirety of the first surface is covered with the electrically insulating layer 210, in FIG. 3 (c) approximately 80-90% of the first surface is covered with the electrically insulating layer. As more than 45% of the total surface area of the substrate is still covered with the electrically insulating layer, substantial savings in power used for ED or MAO may be realized compared to the situation in which there is no electrically insulating layer. FIG. 3(d) show a cross sectional view of the substrate of FIG. 3(c) after it has been treated by MAO or ED and has an MAO or ED layer 220.

It should be noted that in the figures above and below, the relative thickness of the electrically insulating coating 210 and ED or MAO layer 220 is exaggerated for clarity. In most cases the thickness of the substrate 200 will be much greater than the thickness of these two layers. Further, the thickness of the substrate 200 as measured by the distance between the first surface and the second surface will be relatively small compared to the length and width of the substrate.

FIG. 3 (e) shows a cross sectional view of another substrate according to another example. This example is similar to FIG. 3 (a) but in addition to a first surface of the substrate being coated by the electrically insulating coating 210, sides of the substrate are also coated by the electrically insulating coating 210. In general, as mentioned above, the relative thickness of the substrate (distance between the first and second sides) will be fairly small compared to the length and width of the substrate. However, coating the sides with the electrically insulating layer may realize further power and cost savings depending on the thickness of the substrate. FIG. 3 (*f*) shows the substrate of FIG. 3 (*e*) after treatment with MAO or ED.

In the above examples the substrate 200 is illustrated as comprising a single layer of conductive material, such as a metal between the insulating layer 210 and the MAO or ED layer 220. However, it is possible for the substrate 200 to include a plurality of layers. FIG. 3 (*g*) is another example of a substrate, which is similar to FIG. 3 (*a*), except that the substrate 200 comprises a plurality of layers 201, 202, 203. The outer layers 201 203 which form upper and lower surfaces of the substrate should be electrically conductive. The middle layer 202, or in other examples middle layers if there is more than one, may be electrically conductive or electrically insulating. The layers may be of different materials or the same material.

A layer of the substrate 201, 202, 203 may comprise a metal, such as a light metal or light metal alloy including, but not limited to Aluminum, Magnesium, Lithium, Titanium, Zinc or one of their alloys. Alternatively a layer of the substrate 201, 202, 203 may comprise a ceramic, glass fiber or composite material. In one example layers 201 and 203 comprise metals or metal alloys, while layer 202 comprises a composite material including metal and a ceramic or glass fiber.

In other respects, apart from the composition of the substrate 200, the example of FIG. 3 (*g*) is the same as FIG. 3 (*a*). FIG. 3 (*h*) shows the substrate of FIG. 3 (*g*) after treatment by ED or MAO. This multi-layer substrate example may be modified to be similar to any of FIG. 3 (*c*) to FIG. 3 (*f*) in terms of the extent of coverage of the electrically insulating coating 210.

It can be seen that in FIGS. 3(*b*), 3(*d*), 3 (*f*) and 3 (*h*) the MAO or ED layer 220 covers more or less the whole of the second side of the substrate. In other examples, it is possible for part of the second side of the substrate to have an insulating layer too. However, in most cases it is anticipated that at least 90% of the second side of the substrate will be covered with the MAO or ED coating.

Figure 4:
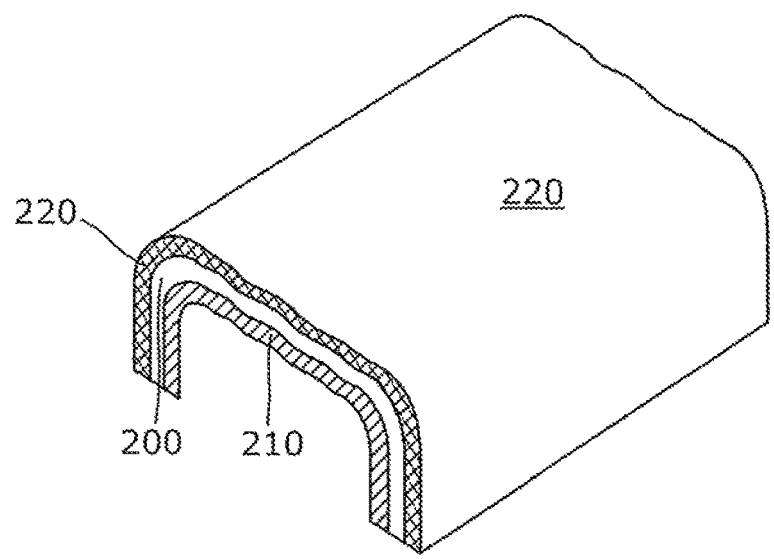
FIG. 4 shows an example perspective view of an electronic device casing, with a cut through showing various layers.

The substrate may be used as a casing for an electronic device. For example the second side of the substrate coated with the MAO or ED layer 220 may act as the exterior wall of the casing, while the insulating layer 210 may act as an interior wall of the casing. FIG. 4 shows a perspective view of a casing for an electronic device, such as a smart phone, with a cut away section so that the various layers can be seen. The casing has a first side which acts as an exterior surface and faces away from the device and a second side which acts as an inner surface and faces towards the device or device components. The casing has a MAO or ED layer 220 on the exterior surface and may have an insulating layer 210 on the inner surface. The main body or the casing is an electrically conductive substrate 200 between the layers 210 and 220.

Figure 5:
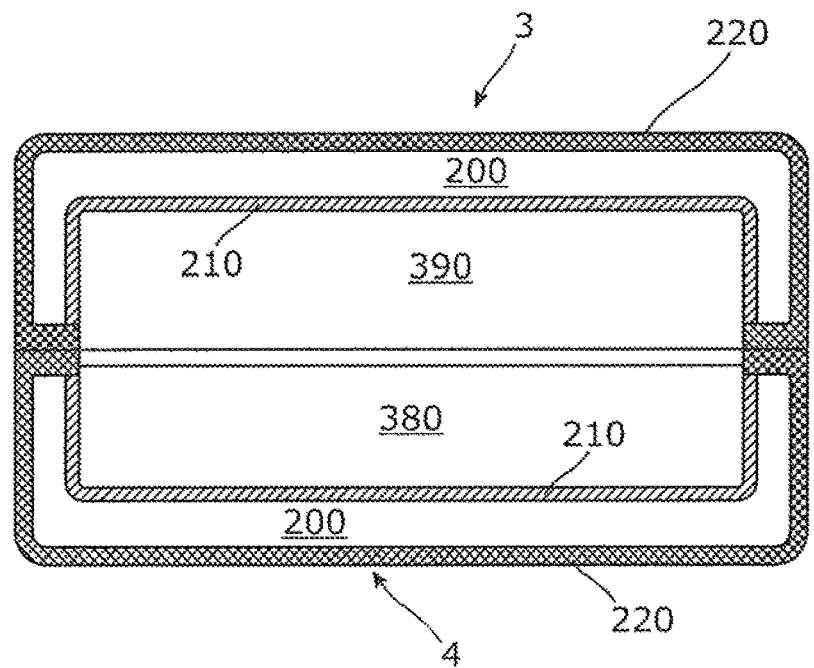
FIG. 5 shows an example schematic view of an electronic device casing.

FIG. 5 is a schematic view of a casing for an electronic device, such as a smart phone, tablet computer or laptop computer. In this example the casing comprises two separate but connected parts: a first part 3 and a second part 4. For example the first part 3 may correspond to a lid or screen portion of a laptop computer, while the second part 4 may correspond to a base or keyboard portion of a laptop computer. The device in this example comprises components inside the casing, such as a screen or display 390 and a keyboard and mother board 380 etc.

Each part of the casing 3, 4 comprises an exterior facing side and an interior facing side. The exterior facing side forms the external wall of the casing, while the interior facing side forms the internal wall and faces the device components 380 or 390. The exterior part of the casing in this example is covered with an MAO or ED layer 220, which may for example provide hardness or durability to the external wall of the casing.

The main body of the casing is a substrate 200 of an electrically conductive material, such as a metal or metal alloy and may comprise one layer or several layers as explained above.

The interior facing surfaces of the main body substrate 200 are coated with an electrically insulating layer 210. As explained above, during the manufacturing process, the electrically insulating layer 210 may have prevented formation of the MAO or ED layer on the inner facing parts, thereby saving electrical power. There is no need to remove the electrically insulating coating 210 as it faces the components of the device, rather than the external environment, and so need not be as hard or aesthetic as the external facing parts of the casing. Therefore the electrically insulating coating 210 may, as shown in FIG. 5, act as the inner wall of the casing.

In other examples, a further inner layer (not shown) may be added on top of the electrically insulating layer 210, if something extra is needed to support the device components or for other reasons. However, in that case even though the electrically insulating layer 210 would not form the inner wall of the casing, it would still be on the 'inner facing' side of the substrate 200.

While the thickness of the MAO or ED layer 220 and the insulating layer 210 in FIGS. 3-5 is exaggerated for clarity, in many cases these layers will be relatively thin compared to the main body substrate 200.

Figure 6:
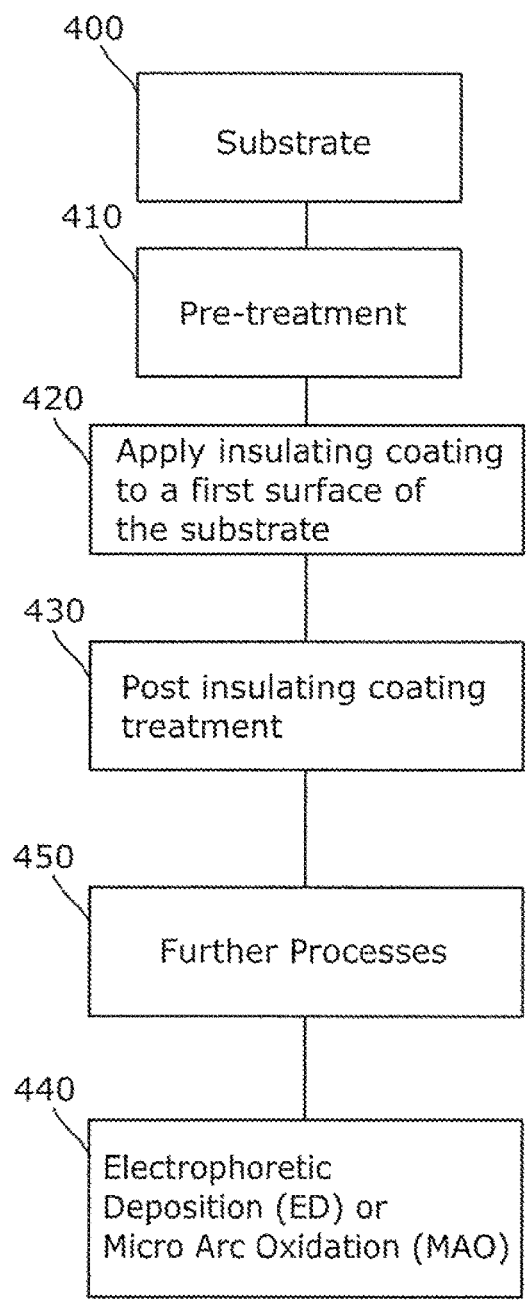
FIG. 6 is a flow chart showing an example method of treating a substrate in more detail.

FIG. 6 is a diagram showing an example process for treating a substrate in more detail. At block 400 the substrate is provided. At 410 various pre-treatments such as cleaning or degreasing of the substrate may carried out. At 420 an electrically insulating layer is applied to a surface of the substrate. At 430 various post insulating layer treatments may be carried out, such as cleaning or degreasing, baking, chemical polishing and/or passivation. At 440 the substrate is treated with ED or MAO and only the surfaces not coated with the electrically insulating layer are affected. At 450 various further processes such as baking may be carried out. In the above "baking" refers to heating of the substrate in an oven or the like, for example at a temperature between 120 and 250 degrees centigrade.

The substrate may be shaped into a suitable form for acting as a casing for an electronic device. For example, the substrate may be cut, molded or 3D printed into a suitable shape. If molded or printed then it should have the suitable shape before going through the processes described in FIG. 6. If cut to a suitable shape then it may be cut before and/or after the processes described in FIG. 6.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A method of treating a substrate comprising a first surface and a second surface, the first surface and the second surface being electrically conductive surfaces on opposite sides of the substrate, the method comprising:
applying an electrically insulating coating to the first surface of the substrate before performing a Micro-Arc Oxidation (MAO) or an electrophoretic deposition (ED);
immersing the substrate with the electrically insulating coating on the first surface into a bath of an electrolyte solution; and
performing the MAO or the ED on the second surface of the substrate, wherein the electrically insulating coating covers at least 80% of the first surface of the substrate, wherein the first surface is an inside surface of a casing for an electronic device and the second surface is an outside surface of the casing.

2. The method of claim 1, wherein the electrically insulating coating is applied by spray coating, film transfer, physical vapor deposition, or printing.

3. The method of claim 1, wherein the electrically insulating coating covers the entire first surface of the substrate so that after performing the MAO or the ED, the first surface is not covered with an MAO or ED layer.

4. The method of claim 1, wherein the substrate has an edge connecting the first surface and the second surface and wherein the insulating coating is applied to said edge as well as to the first surface of the substrate.

5. The method of claim 1, wherein after the performing the MAO or the ED, at least 90% of the second surface is covered with a MAO layer or an ED layer.

6. The method of claim 1, wherein the electrically insulating layer comprises a material selected from the group comprising: polyimides, ABS (Acrylonitrile, butadiene and styrene), polyacetate, polyacrylics, nylon, epoxy, fluoropolymer, Neoprene, PEEK (PolyEtherEther-Ketone), PET (Polyethylene terephthalate), phenolics, polycarbonate, polyester, polyolefins, polystyrene, polysulfones, polyurethanes, polyvinylchloride (PVC), silicone rubber, PEI (polyetherimide), and low dielectric constant materials.

7. The method of claim 1, wherein the MAO is carried out with an electrolyte including a material selected from the group comprising: silicate, aluminate, sulfate, aluminum powder, aluminum alloy powder, zinc oxide, sodium hydroxide, potassium hydroxide, potassium fluoride, aluminum hydroxide, borate, carbonate, rare earth element, and aluminum oxide ($Al_2O_3$).

8. The method of claim 1, wherein the electrophoretic deposition comprises a polymer in combination with particles selected from the group comprising inorganic particles and metallic particles.

9. A casing for an electronic device comprising:
a substrate, a Micro-Arc Oxidation (MAO) layer or an electrophoretic deposition (ED) layer on an exterior surface of the substrate; and
an electrically insulating layer on an inner surface of the substrate to prevent the MAO layer or the ED layer from forming on portions of the substrate with the electrically insulating layer when the substrate is immersed in a bath of an electrolyte solution, wherein the exterior surface of the substrate faces an exterior of the casing and the inner surface of the substrate faces an interior of the casing.

10. The casing of claim 9, wherein the insulating layer comprises a material selected from the group comprising: polyimides, ABS (Acrylonitrile, butadiene and styrene), polyacetates, polyacrylics, nylon, epoxy, fluoropolymers, Neoprene, PEEK (PolyEtherEther-Ketone), PET (Polyethylene terephthalate), phenolics, polycarbonates, polyesters, polyolefins, polystyrene, polysulfones, polyurethane, polyvinylchloride (PVC), silicone rubber, PEI (polyetherimide), and low dielectric constant materials.

11. The casing of claim 9, wherein the MAO layer comprises a metal oxide which has an at least partially crystalline structure.

12. The casing of claim 9, wherein the substrate comprises a plurality of electrically conductive layers between the ED or MAO layer and the electrically insulating layer.

13. A casing for an electronic device comprising:
a substrate having a surface area;
a first portion of the surface area of the substrate being covered with an electrically insulating layer; and
a second portion of the surface area of the electrically conductive substrate being covered with a Micro-Arc Oxidation (MAO) layer or an electrophoretic deposition (ED) layer, wherein the electrically insulating layer is to prevent the MAO layer or the ED layer from forming on the first portion of the surface area of the substrate that is covered with the electrically insulating layer when the substrate is immersed in a bath of an electrolyte solution, wherein the first portion comprises at least 45% of the surface area of the substrate, wherein the first portion of the surface area includes an inside surface of the casing and the second portion of the surface area includes an outside surface of the casing.

14. The casing of claim 13, wherein the substrate comprises a light metal or light metal alloy selected from the group comprising aluminum, magnesium, lithium, titanium, zinc, and their alloys.

* * * * *